US008640054B2

(12) United States Patent
Jha et al.

(10) Patent No.: US 8,640,054 B2
(45) Date of Patent: Jan. 28, 2014

(54) TUNING DIAL USER INTERFACE

(75) Inventors: Hemant Jha, Los Angeles, CA (US); Manabu Sakamoto, Santa Monica, CA (US); Ryutaro Sakai, Marina Del Ray, CA (US)

(73) Assignees: Sony Corporation, Tokyo (JP); Sony Electronics Inc., Park Ridge, NJ (US)

( * ) Notice: Subject to any disclaimer, the term of this patent is extended or adjusted under 35 U.S.C. 154(b) by 1169 days.

(21) Appl. No.: 11/559,639

(22) Filed: Nov. 14, 2006

(65) Prior Publication Data

US 2007/0216665 A1    Sep. 20, 2007

Related U.S. Application Data

(60) Provisional application No. 60/782,585, filed on Mar. 14, 2006.

(51) Int. Cl.
*G09G 5/00*    (2006.01)
(52) U.S. Cl.
USPC ........... 715/853; 715/854; 715/771; 715/727; 345/184
(58) Field of Classification Search
USPC ................... 715/853, 854, 771, 727; 345/184
See application file for complete search history.

(56) References Cited

U.S. PATENT DOCUMENTS

| | | | |
|---|---|---|---|
| 5,382,188 A * | 1/1995 | Tomellini | 446/397 |
| 5,444,194 A | 8/1995 | Reinke | |
| D362,442 S | 9/1995 | Goldfarb | |
| D367,476 S | 2/1996 | Martin | |
| 5,812,796 A | 9/1998 | Broedner et al. | |
| 5,898,650 A | 4/1999 | Porsbo et al. | |
| 6,005,299 A * | 12/1999 | Hengst | 307/10.1 |
| D432,518 S | 10/2000 | Muto | |
| 6,154,201 A | 11/2000 | Levin et al. | |
| D440,557 S | 4/2001 | Su | |
| 6,236,398 B1 * | 5/2001 | Kojima et al. | 345/419 |
| 6,351,222 B1 | 2/2002 | Swan et al. | |

(Continued)

FOREIGN PATENT DOCUMENTS

JP    2002367491 A2    12/2002

OTHER PUBLICATIONS http://www.tokmet.com/software/D500M%20Manual.pd.; User's Manual for the Automated Denture Furnace for Metal Ceramics; Dentamatic 550/Chameleon-M; 7pps.

(Continued)

*Primary Examiner* — Daeho Song
(74) *Attorney, Agent, or Firm* — Fitch, Even, Tabin & Flannery LLP (57) ABSTRACT

A controller for use by a user is utilized to select media for playback by an entertainment system. A display displays a hierarchy of levels of options to the user. One level of the hierarchy of levels is displayed at a time. A physical dial is utilized to select an option on the one level of the hierarchy of levels in response to a physical movement of the physical dial. A processing device updates the display of the hierarchy of levels in response to selection of the option by the user. The processing device performs one of the following in response to the user selecting the option on the one level: (a) displaying a higher level of the hierarchy of levels, or (b) generating an instruction to cause media corresponding to the option to be played by the entertainment system.

20 Claims, 10 Drawing Sheets

(56) References Cited

U.S. PATENT DOCUMENTS

| | | | |
|---|---|---|---|
| D467,897 S | 12/2002 | Lin | |
| 6,587,739 B1 | 7/2003 | Abrams et al. | |
| 6,703,962 B1 | 3/2004 | Marics et al. | |
| 6,710,754 B2 | 3/2004 | Hanson et al. | |
| 7,095,867 B2 | 8/2006 | Schul et al. | |
| D550,650 S | 9/2007 | Patel et al. | |
| D554,619 S | 11/2007 | Solland | |
| D561,175 S | 2/2008 | Zhang | |
| D565,547 S | 4/2008 | Griffen et al. | |
| D567,224 S | 4/2008 | Laituri et al. | |
| D584,290 S | 1/2009 | Lee | |
| D597,525 S | 8/2009 | Jha | |
| 7,679,524 B2 | 3/2010 | Hofer et al. | |
| 2001/0026504 A1* | 10/2001 | Nonaka et al. | 369/32 |
| 2003/0048254 A1 | 3/2003 | Huang | |
| 2003/0132911 A1* | 7/2003 | Narioka et al. | 345/156 |
| 2003/0197740 A1* | 10/2003 | Reponen | 345/810 |
| 2004/0100440 A1 | 5/2004 | Levin et al. | |
| 2004/0207607 A1 | 10/2004 | Specks et al. | |
| 2005/0076307 A1* | 4/2005 | Robbin | 715/792 |
| 2005/0081164 A1* | 4/2005 | Hama et al. | 715/830 |
| 2005/0138564 A1* | 6/2005 | Fogg | 715/745 |
| 2005/0168435 A1 | 8/2005 | Reed et al. | |
| 2006/0109134 A1 | 5/2006 | Aisa | |
| 2006/0146165 A1* | 7/2006 | Hagiwara et al. | 348/333.01 |
| 2006/0164389 A1* | 7/2006 | Ringot | 345/157 |
| 2006/0164403 A1* | 7/2006 | Volckers | 345/184 |
| 2006/0184871 A1* | 8/2006 | Waters | 715/512 |
| 2006/0195789 A1* | 8/2006 | Rogers et al. | 715/727 |
| 2007/0216665 A1 | 9/2007 | Jha et al. | |
| 2007/0229215 A1 | 10/2007 | Jha | |
| 2008/0297339 A1 | 12/2008 | Mathews et al. | |

OTHER PUBLICATIONS www.7-forum.com; 734.com; the iDrive system in the new 7er; 11 pps.

Robert Bosch GMBH; Blaupunkt; http://www.bosch-presse.de; Aug. 2004; 3 pps.

Rivituso, Monica; Sirius Unveils Its Latest Products; SmartMoney.com; Aug. 26, 2005; 2 pps.

http://www.apple.com/support/manuals/ipod; iPod User's Guide; 2004 Apple Computer, Inc. 64 pps.

U.S. Appl. No. 11/554,886, Jha, Hemant.

www.bang-olufsen.com; BeoCenter2; Features and Specifications; Bang & Olufsen; 26 pps.

www.bang-olufsen.com; BeoCenter2; 2 pps.

"Smart Architectural Surfaces; Object-Based Media Group", MIT Media Laboratory; Fall/Winter 2005-2006; 2 pps.; http://web.media.mit.edu.

Hemant, Jha, U.S. Appl. No. 29/250,432.

Notice of Allowance from U.S. Appl. No. 29/250,432 mailed Apr. 30, 2009.

"BeoCenter 2 User Guide;", Bang & Olufsen website; http://www.bang-olufsen.com/beocenter2; downloaded Aug. 13, 2009; 44 pages.

Jha, Hemant, U.S. Appl. No. 11/554,886, filed Oct. 31, 2006.

Notice of Allowance from U.S. Appl. No. 29/339,541 mailed Oct. 5, 2009.

Advisory Action for U.S. Appl. No. 11/554,886 mailed Nov. 14, 2011.

Examiner Interview Summary for U.S. Appl. No. 11/554,886 mailed Nov. 14, 2011.

Advisory Action from U.S. Appl. No. 11/554,886 mailed Nov. 20, 2012.

Final Office Action from U.S. Appl. No. 11/554,886 mailed Aug. 16, 2011.

Final Office Action from U.S. Appl. No. 11/554,886 mailed Sep. 28, 2010.

Final office action from U.S. Appl. No. 11/554,886 mailed Jul. 30, 2012.

Non Final Office Action from U.S. Appl. No. 11/554,886 dated Dec. 21, 2011.

Non Final Office Action from U.S. Appl. No. 11/554,886 mailed Apr. 14, 2011.

Non-Final Office Action from U.S. Appl. No. 11/554,886 mailed Apr. 1, 2010.

Notice of Allowance from U.S. Appl. No. 29/352,900 mailed Feb. 22, 2010.

Supplemental Notice of Allowability from U.S. Appl. No. 29/339,541 mailed Feb. 4, 2010.

Jha; U.S. Appl. No. 29/339,541, filed Jul. 1, 2009.

Jha; U.S. Appl. No. 29/352,900, filed Dec. 29, 2009.

Examiners Answer from U.S. Appl. No. 11/554,886 mailed May 17, 2013 (12 pgs).

\* cited by examiner

TUNING DIAL USER INTERFACE

This application claims priority to provisional application Ser. No. 60/782,585, filed Mar. 14, 2006, the disclosure of which is hereby incorporated by reference.

FIELD OF THE APPLICATION

The present invention relates generally to a user-manipulated tuning dial interface.

BACKGROUND

Radio dials for home entertainment systems or car stereos systems are utilized to indicate the frequency of a radio station to which a user is listening. Older radio dials contained manual knobs for changing the tuning frequency to allow the user to change the station to which he/she is listening. Many newer radio dials use digital displays to allow a user to scan through available radio channels. Both types of radio dials allow a user to select the media content at one time. In this case, it is the frequency of the radio station. They do not allow the user to make a selection regarding radio content and then further define a type of content to which to listen within that selection.

Apple Computer's iPod™ portable music-playing device displays information pertaining to a user's playlists of music files stored in a memory of the device. The device includes a dial that can be manipulated by the user. However, the user is provided with only a single layer of navigation at a time. For example, the user is shown a main display screen and from that screen can select a music file from a directory to be played.

Sirius™ satellite radio provides a portable radio player with a tunable dial that can be tilted to pause, save songs, and fast forward. The Sirius™ satellite radio only allows the user to set the station to which to listen.

Many home audio products have knob controllers to control radio tuners or volume levels. The audio products are typically simple and only display one type of user-manipulable information at a time to the user, such as the radio station or volume level. They do not, however, allow the user to make a selection of the user-manipulable information and then provide a means for further defining the selection.

Accordingly, none of the present entertainment systems provides a means for allowing a user to select a generic type of content to play, and then further define the content within the generic type to ensure that the content being played is the best suited for the user's listening preferences.

SUMMARY

The present invention is directed to a controller for selecting media for playback by an entertainment system. According to an embodiment of the invention, a display shows a hierarchy of levels of options to a user. One level of the hierarchy is displayed at a time. A physical dial is utilized to select an option on the one level of the hierarchy in response to physical movement of the physical dial. A processing device updates the display of the hierarchy of levels in response to selection of the option by the user. In response to the user selecting the option on the one level, one of the following is performed: (a) displaying a higher level of the hierarchy of levels, or (b) generating an instruction to cause media corresponding to the option to be played by the entertainment system.

Other embodiments of the present invention are further directed to a method for selecting media for playback by an entertainment system. A hierarchy of levels of options is displayed to a user. One level of the hierarchy is displayed at a time. An option on the one level of the hierarchy is selected in response to physical movement of a physical dial. The displaying of the hierarchy of levels is updated in response to the selecting of the option by the user. In response to the user selecting the option on the one level, one of the following is performed: (a) displaying a higher level of the hierarchy of levels, or (b) generating an instruction to cause media corresponding to the option to be played by the entertainment system.

Other embodiments of the present invention are further directed to an entertainment system for playing media. A controller selects media for playback. The controller includes a display to display a hierarchy of levels of options to a user. One level of the hierarchy is displayed at a time. The controller also includes a physical dial to select an option on the one level of the hierarchy in response to physical movement of the physical dial. The controller further includes a processing device to update the display of the hierarchy of levels in response to selection of the option by the user. In response to the user selecting the option on the one level, one of the following is performed: (a) displaying a higher level of the hierarchy of levels, or (b) generating an instruction to cause media corresponding to the option to be played by the entertainment system. The entertainment system also includes at least one speaker to play the media corresponding to the instruction.

The above summary of the present invention is not intended to represent each embodiment or every aspect of the present invention. The detailed description and Figures will describe many of the embodiments and aspects of the present invention.

BRIEF DESCRIPTION OF THE DRAWINGS

The above and other aspects, features and advantages of the present embodiments will be more apparent from the following more particular description thereof, presented in conjunction with the following drawings wherein.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Embodiments of the present invention are directed to a tuning dial interface having multi-level navigation and selection options. The tuning dial interface is utilized to control a home entertainment system or any other electronic device requiring user input. The tuning dial interface includes a physical knob that a user can manipulate to select media to be played on a Compact Disc ("CD") or Digital Versatile Disc ("DVD") player, media stored on a hard disk or portable storage device, or radio station broadcasts received by a tuner of the entertainment system. The tuning dial interface is also be utilized to skip tracks or change the volume of the entertainment system.

The tuning dial is in communication with a display screen, such as a Liquid Crystal Display ("LCD"). The tuning dial extends vertically in a direction away from the display screen. In the event that the entertainment system is turned off or the display screen is in a hibernate mode, the user may turn the display screen back on or wake up the display screen from the hibernate mode by touching the tuning dial. In some embodiments, the user presses down on the tuning dial to turn on or wake up the display screen. In other embodiments, the user tilts the tuning dial, squeezes the tuning dial, or rotates the tuning dial. In an additional embodiment, the display turns on if the user simply touches the tuning dial. For example, the tuning dial may be in communication with a detector that detects a resistance level or voltage known to correspond to that of a human being.

Upon turning on the display screen, a first screen of user-selectable options is displayed. A circle is displayed in an area around the dial interface, and the user-selectable options are displayed at various locations on the circle, such as at 30 degrees, 60 degrees, 90 degrees, and so forth. The user-selectable options for the first screen comprise basic options, such as the source of media to be played on the entertainment system. For example, the user may be presented with options such as "portable," "hard disk," "compact disc," "FM radio," and "AM radio." Many alternative options may also be presented, depending on the particular application to indicate a source of the media. The user selects the option by turning the dial. As the dial turns, a selection line segment displayed on the display screen moves and points at user-selectable options as it moves. When the user stops moving the dial and the selection line segment is pointing at the desired user-selectable option, the selection is made by pressing down on the dial or on a button on the dial. Alternatively, stopping the movement of the dial for a predetermined length of time causes the option to be selected. A selected option may be displayed with a different color or light intensity from other options, to set it apart and clearly give the indication that it is the selected option.

Upon selecting the option on the first display screen, an additional set of options is displayed. These new options are narrower in scope than the set of options on the first display screen. As discussed above, the first set of options is directed to the source of the media to be played. The second set of options is directed to a type of media stored on the item corresponding to the first selected option or associated with the first option in some way. For example, in the event that the user had selected the "hard disk" option from the first screen, the second set of options that are displayed comprise different types of media stored on the hard disk, such as photographs, music, and videos. When the second screen is displayed, a circle or other shape is illuminated, and the various user-selectable options for this displayed screen are shown. Again, as with the first screen, the user selects the desired user-selectable option via use of the dial. The user-selectable options from the first screen are faded or completely removed, but the first circle continues to be displayed so that it is obvious that the user is currently on the second level of user-selectable options. The original circle is slightly faded in color or displayed with less intensity and decreases in diameter and therefore moves closer to the location at which the dial is coupled to the display. By maintaining the display of the original circle in addition to the circle for the second display screen, the user quickly appreciates that he/she is on the second level of user-selectable options in a hierarchy of user-selectable options provided by the controller.

Multiple additional levels of user-selectable options may also be displayed, and the user can select options in this hierarchy via the dial. When the user eventually reaches the highest level, the selected content is played for the user's enjoyment on the entertainment system.

Figure 1:
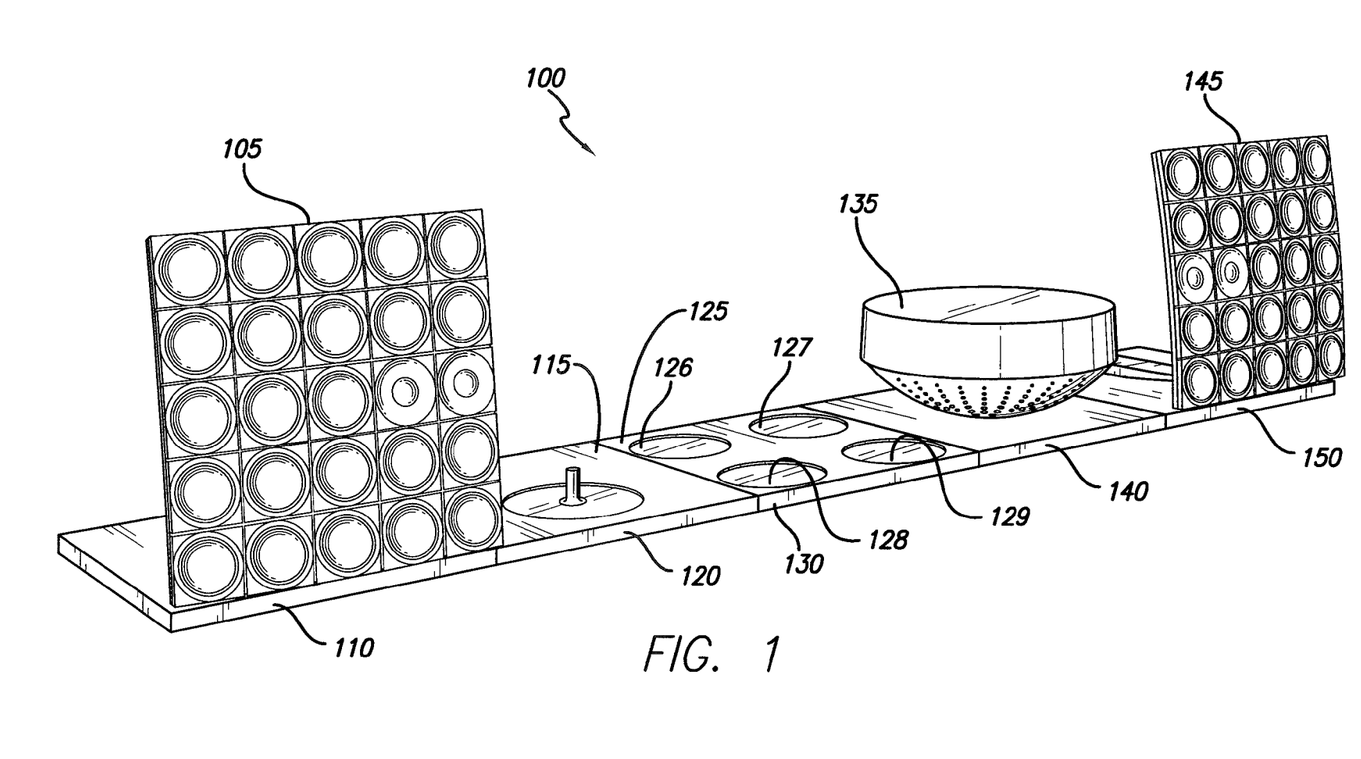
FIG. 1 illustrates an entertainment system according to an embodiment of the invention.

FIG. 1 illustrates an entertainment system 100 according to an embodiment of the invention. The entertainment system 100 is comprised of a plurality of electronic components affixed to movable panels. As illustrated, a left loudspeaker 105 is affixed to a first panel 110. The left loudspeaker 105 is comprised of an array of drivers, such as, for example, 25 drivers. The drivers include midrange and high frequency drivers driven by amplifiers built into their bases.

A controller 115 is affixed to a second panel 120. The controller 115 is utilized to select media to be played with sound output to, for example, loudspeakers such as the left loudspeaker 105. The controller 115 presents a display to a user and allows the user to select media to be played, as well as, for example, volume levels and acoustic characteristics.

A CD player and changer 125 is affixed to a third panel 130. The CD player and changer 125 holds 4 discs as shown or more or fewer than 4 discs in different embodiments. The user selects a disc to be played by manipulating a display presented by the controller 115. In the even that a disc, or a song of the disc, is selected, media is read off the disc and played for the user's enjoyment. In some embodiments, the selected disc is moved over to an optical head that reads the media off the disc. For example, the selected disc sinks down into the CD player and changer 125 and is then transported to the center of the CD player and changer 125 where it is played. In alternative embodiments an optical head may be located beneath each of the disc holding indentations of the CD player and changer 125. As shown, the CD player and changer 125 includes four indentations for holding the discs, a first indentation 126, a second indentation 127, a third indentation 128, and a fourth indentation 129.

It should be appreciated that media other than CD discs, such as CD-ROMs, may be played. For example, in some embodiments the CD player and changer 125 is replaced with a DVD player and changer so that DVDs can be played back for the user's enjoyment. In alternative embodiments, the CD player and changer 125 is capable of playing other types of discs such as blu-ray discs.

A subwoofer 135 is affixed to a fourth panel 140. The subwoofer 135 is utilized to playback low frequency audio. Finally, a right loudspeaker 145 is affixed to a fifth panel 150. The right loudspeaker 145 is substantially the same as the left loudspeaker 105. The combination of the left loudspeaker and the right loudspeaker is utilized to provide an audible stereo effect for listeners. The left loudspeaker 105 and the right loudspeaker 145 may be purely stereo speakers in which Digital Signal Processor ("DSP") control over the drivers is not required.

The combination of the first panel 110, second panel 120, third panel 130, fourth panel 140, and fifth panel 150 is placed on a flat surface such as a table or bookshelf to provide a visually pleasing entertainment center. The first panel 110, second panel 120, third panel 130, fourth panel 140, and fifth panel 150 each has approximately the same dimensions. For example, in the illustrated embodiment, each has a rectangular or square shape, and each side has a length of approximately 15 inches and is relatively thin with a thickness of about 0.75 inches. It should be appreciated that the dimensions of the panels may differ in other embodiments, depending on the requirements. It should also be appreciated that although five panels are shown in FIG. 1, more or fewer than five panels may alternatively be utilized, depending on the embodiment.

Figure 2:
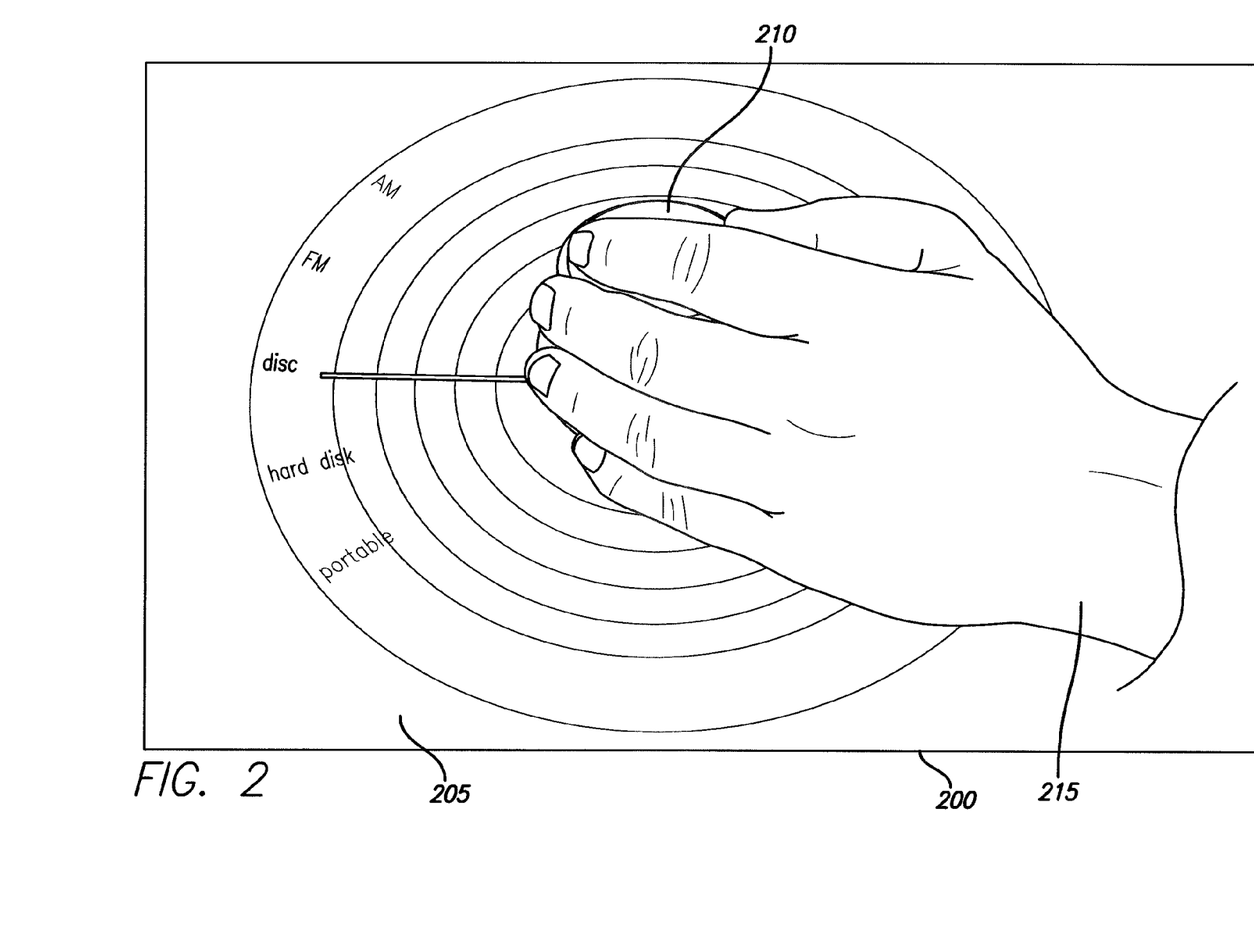
FIG. 2 illustrates a controller to be utilized with an entertainment system according to an embodiment of the invention.

FIG. 2 illustrates a controller 200 to be utilized with an entertainment system according to an embodiment of the invention. The entertainment system is the entertainment system 100 discussed above with respect to FIG. 1. The controller 200 comprises a display screen 205 and a tuning dial 210. The display screen 205 may be a Liquid Crystal Display ("LCD"), Cathode Ray Tube ("CRT"), or any other suitable type of electronic display device. The tuning dial 210 extends above the display screen 205 and can be rotated and/or depressed by a user 215 to select media options to be played by the entertainment system, as discussed below with respect to FIGS. 3-11. In alternative embodiments, the tuning dial 210 may also be tilted by the user to make a selection from among a set of displayed user-selectable options or may include a button that the user may depress to make a selection.

Figure 3:
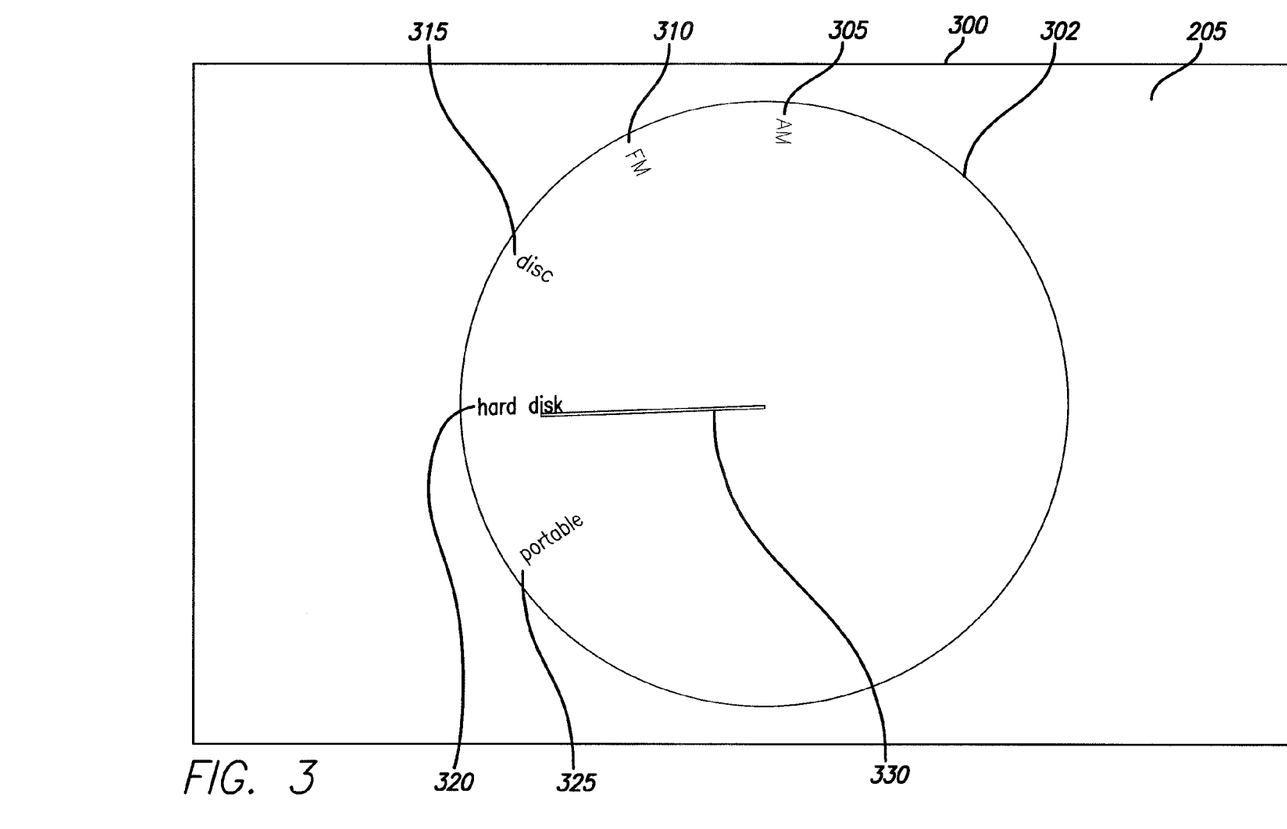
FIG. 3 illustrates a first screen displayed on the display according to an embodiment of the invention.

FIG. 3 illustrates a first screen 300 displayed on the display 205 according to an embodiment of the invention. The display 205 is initially be turned off or is in a pause or hibernate mode until the user 215 depresses, turns, or tilts the tuning dial 210 discussed above with respect to FIG. 2. For clarity of illustration, the tuning dial 210 is not shown in FIG. 3, but a person of ordinary skill in the art would readily appreciate that a displayed first circle 302 of user-selectable options on the first screen 300 would be shown in an area around the tuning dial 210 shown in FIG. 2.

After the display 205 turns on or exits the pause or hibernate mode, the first screen 300 is displayed on the display 205. The first screen 300 includes user-selectable options regarding media to be played on the entertainment system. The user-selectable options are displayed at various locations around the first circle 302. In this case, the user-selectable options contain selections regarding a source of the media to be played. The first set of user-selectable options comprise an AM radio option 305, an FM radio option 310, a disc option 315, a hard disk option 320, and a portable option 325. The AM radio option 305 corresponds to the AM frequency band. The FM radio option 310 corresponds to the FM frequency band. The disc option 315 corresponds to a CD or DVD disc to be played on a CD player and/or DVD player of the entertainment system. The hard disc option 320 corresponds to one or more hard disk drives accessible by the entertainment system. The portable option 325 corresponds to portable media such as a flash memory drive or a portable music player such as an Apple iPod™. It should be appreciated that additional options may also be included. For example, a "Favorites" or a "Settings" options could be included. The "Favorites" option could provide a shortcut to bypass the various levels of navigation discussed below, to quickly select the content to be played by the entertainment system. The "Settings" option could be utilized to set up certain things, such as the volume level, for example, of the entertainment system.

The first screen 300 also includes a selection line segment 330 that points in a direction of a user-selectable option. By rotating, depressing, or tilting the tuning dial 210, the user may select among the user-selectable options. The selection line segment 330 is utilized to point at the option currently being selected via the tuning dial 210. In this case, the selected user-selectable option is the hard disc option 320. The user-selectable option to which the selection line segment 330 points is also be displayed more prominently than other user-selectable options. For example, the selected user-selectable option may be displayed with a larger font, greater light intensity, or different color than the other user-selectable options. User-selectable options located near the selected user-selectable option may be displayed more prominently than those located farther from the selected user-selectable option. For example, user-selectable options located near the selected user-selectable option may be displayed with greater light intensity or a larger font size than those user selectable-options located farther away.

When the user has selected the appropriate user-selectable option, a new screen of another set of user-selectable options that are narrower than the user-selectable options shown in FIG. 3 is displayed. For example, in the event that the user had selected the FM option 310, the new screen may display various FM radio frequencies that the user can select, and based on the user's selection of a particular FM radio frequency, the selected FM radio frequency will be played back for the user via the entertainment system.

To choose a user-selectable option, the user rotates, clicks, or tilts the dial until the selection line segment points at the desired user-selectable option. In the embodiment shown in FIG. 3, the desired user-selectable option is the hard disk option 320. To select this option and move to the next screen, the user may depress or tilt the tuning dial 210. Alternatively, the user may stop moving the tuning dial 210 and the option is automatically selected after having the selection line segment 330 point at it for a predetermined amount of time, such as, for example, 5 seconds. After the option has been selected, the user-selectable options fades or completely disappears, and the first circle 302 shrinks in diameter, i.e., it arcs toward the axis to which the tuning dial 210 is affixed.

Figure 4:
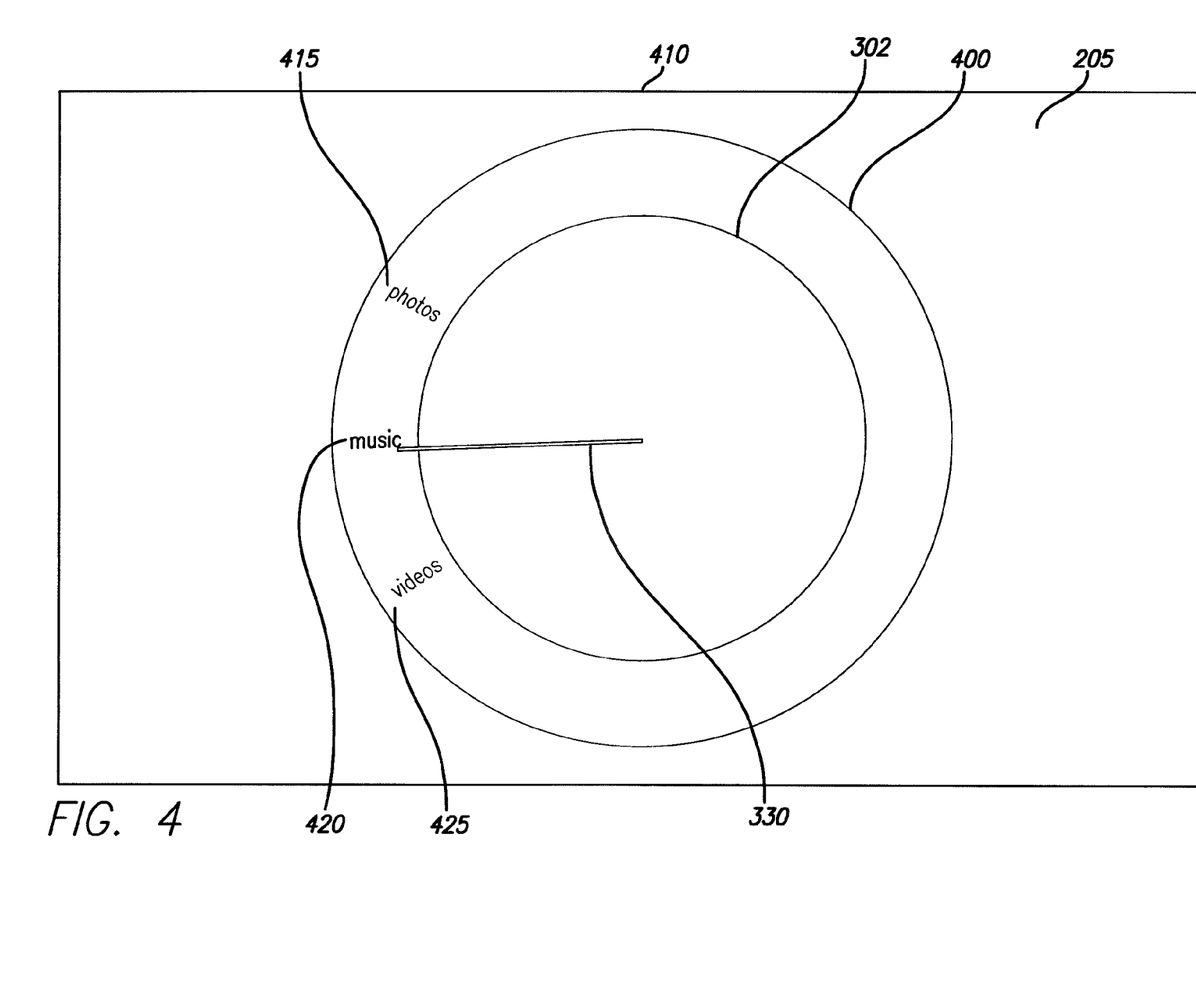
FIG. 4 illustrates a second screen displayed on the display according to an embodiment of the invention.

FIG. 4 illustrates a second screen 400 displayed on the display 205 according to an embodiment of the invention. As shown, the first circle 302 from FIG. 3 has shrunk in diameter. A second circle 410 is shown with a new set of user-selectable options. In this case, because the user selected the hard disk option 320 on the first screen 300 shown in FIG. 3, the second screen 400 presents options as to various types of selectable media stored on the hard disk of the entertainment system. As shown, the user is provided with a photos option 415, a music option 420, and a videos option 425. Other user-selectable options may also be presented to the user, depending on the application. The selection line segment 330 is utilized to select among the available user-selectable options, similar to the way that it is utilized to select among user-selectable options on the first screen 300 as shown in FIG. 3. Also, the chosen user-selectable option may be displayed with a different color, larger text size, different font, or in any other away to set it apart from the other user-selectable options. Also, the user-selectable options closest to the user-selectable option to which the selection line segment is pointing may also be displayed more prominently than user-selectable options farther away, to give an appearance such that the user-selectable options far away are faded. In this case, the user selects the music option 420. The second circle 410 and the first circle 302 subsequently decrease in diameter and move closer to the axis of the tuning dial 210.

Figure 5:
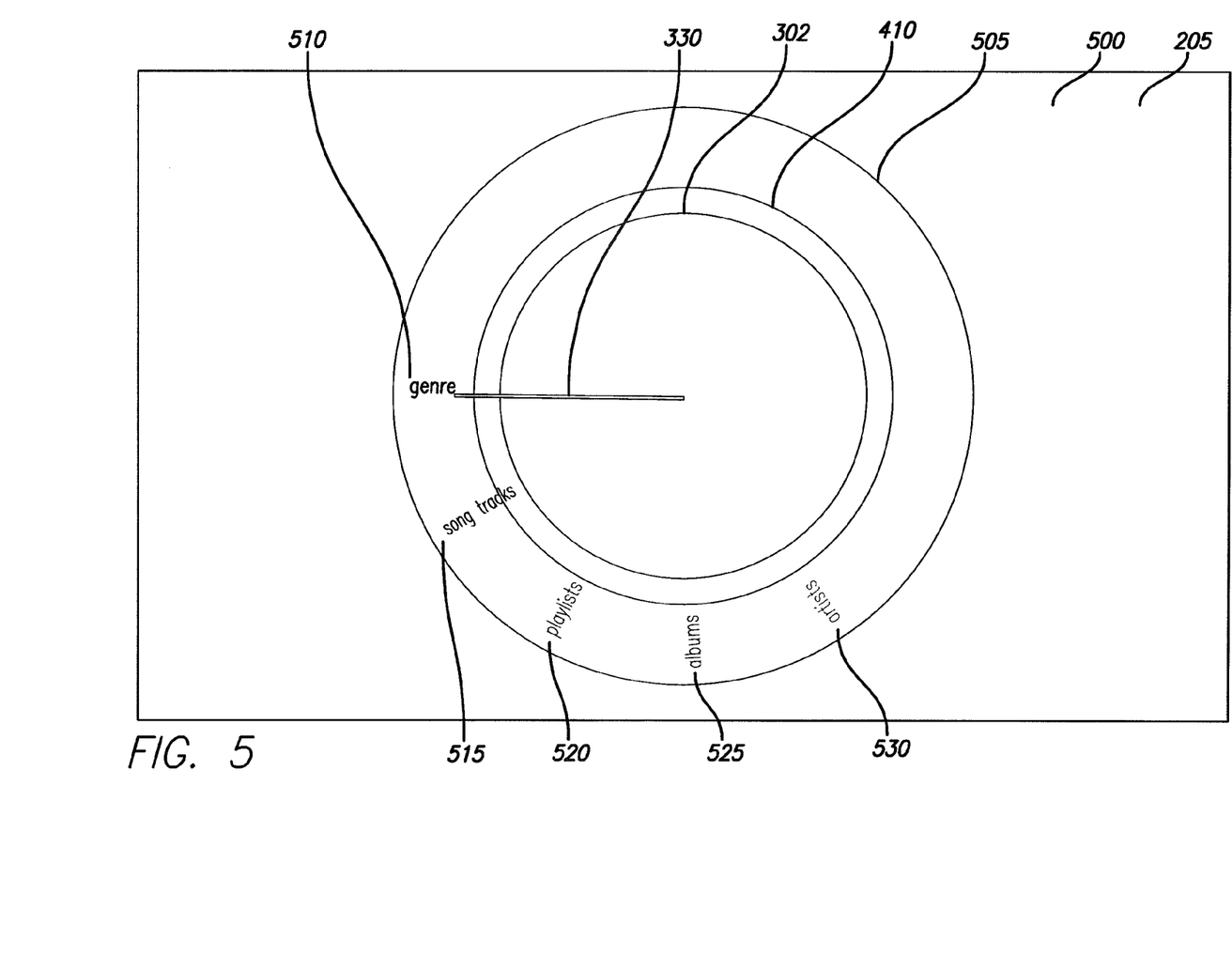
FIG. 5 illustrates a third screen displayed on the display according to an embodiment of the invention.

FIG. 5 illustrates a third screen 500 displayed on the display 205 according to an embodiment of the invention. As shown, the first circle 302 and the second circle 410 from FIG. 4 have shrunk in diameter. A third circle 505 is shown with a new set of user-selectable options. In this case, because the user selected the music option 420 on the second screen 400 shown in FIG. 4, the third screen 500 presents options as to various music options of selectable media stored on the hard disk of the entertainment system. As shown, the user is provided with a genre option 510, a song tracks option 515, a playlists option 520, an albums option 525, and an artists option 530. Other user-selectable options may also be presented to the user, depending on the application. As with the first screen 300 and the second screen 400, the selection line segment 330 is utilized to select among the available user-selectable options. In this case, the user selects the genre option 510.

Figure 6:
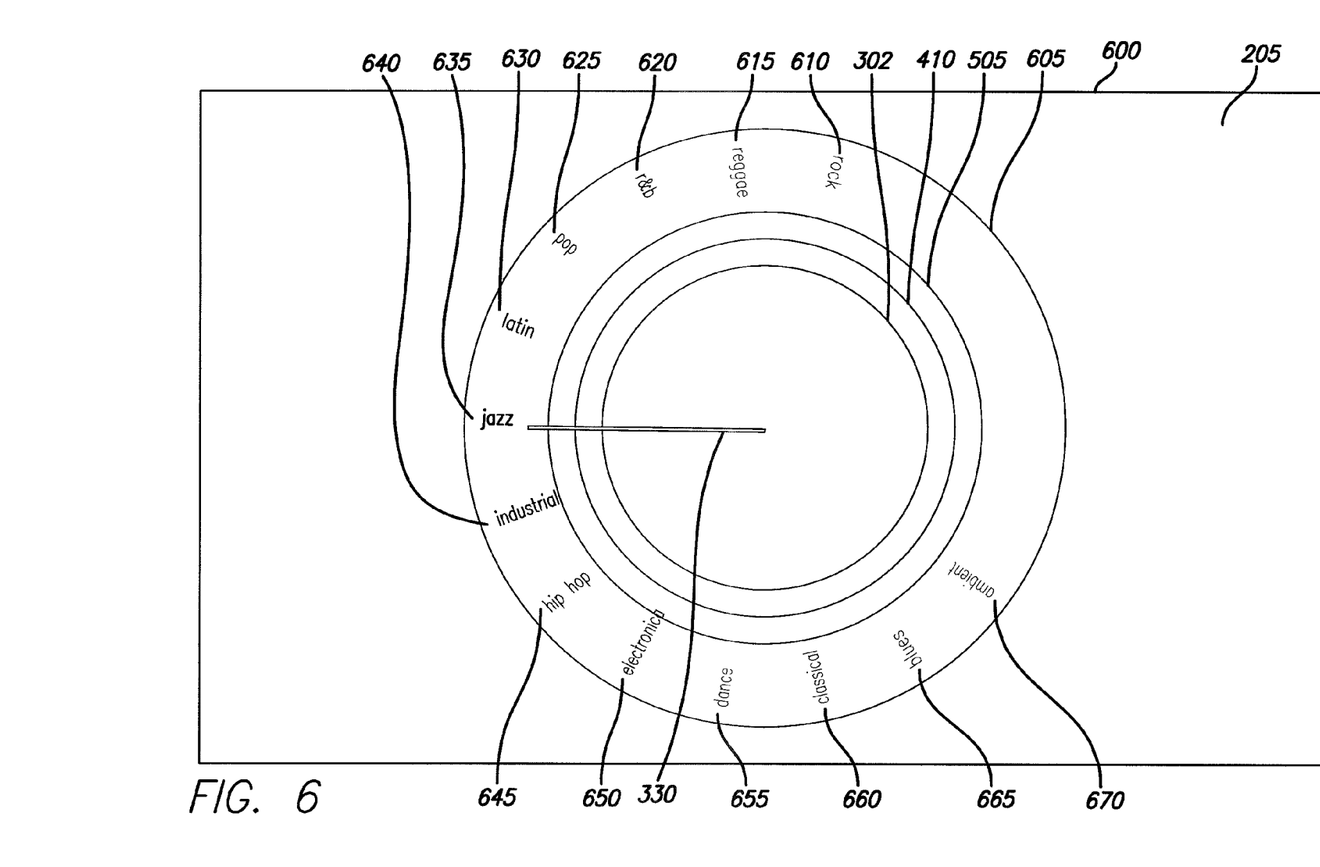
FIG. 6 illustrates a fourth screen displayed on the display according to an embodiment of the invention.

FIG. 6 illustrates a fourth screen 600 displayed on the display 205 according to an embodiment of the invention. As shown, the first circle 302, the second circle 410, and the third circle 505 from FIG. 5 have shrunk in diameter. A fourth circle 605 is shown with a new set of user-selectable options. In this case, because the user selected the genre option 510 on the third screen 500 shown in FIG. 5, the fourth screen 600 presents options as to various genres of music to be played by the entertainment system. As shown, the user is provided with a rock option 610, a reggae option 615, an R & B option 620, a pop option 625, a Latin option 630, a jazz option 635, an industrial option 640, a hip hop option 645, an electronica option 650, a dance option 655, a classical option 660, a blues option 665, and an ambient noise option 670. The selection line segment 330 is utilized to select among the available user-selectable options. In this case, the user selects the jazz option 635.

Figure 7:
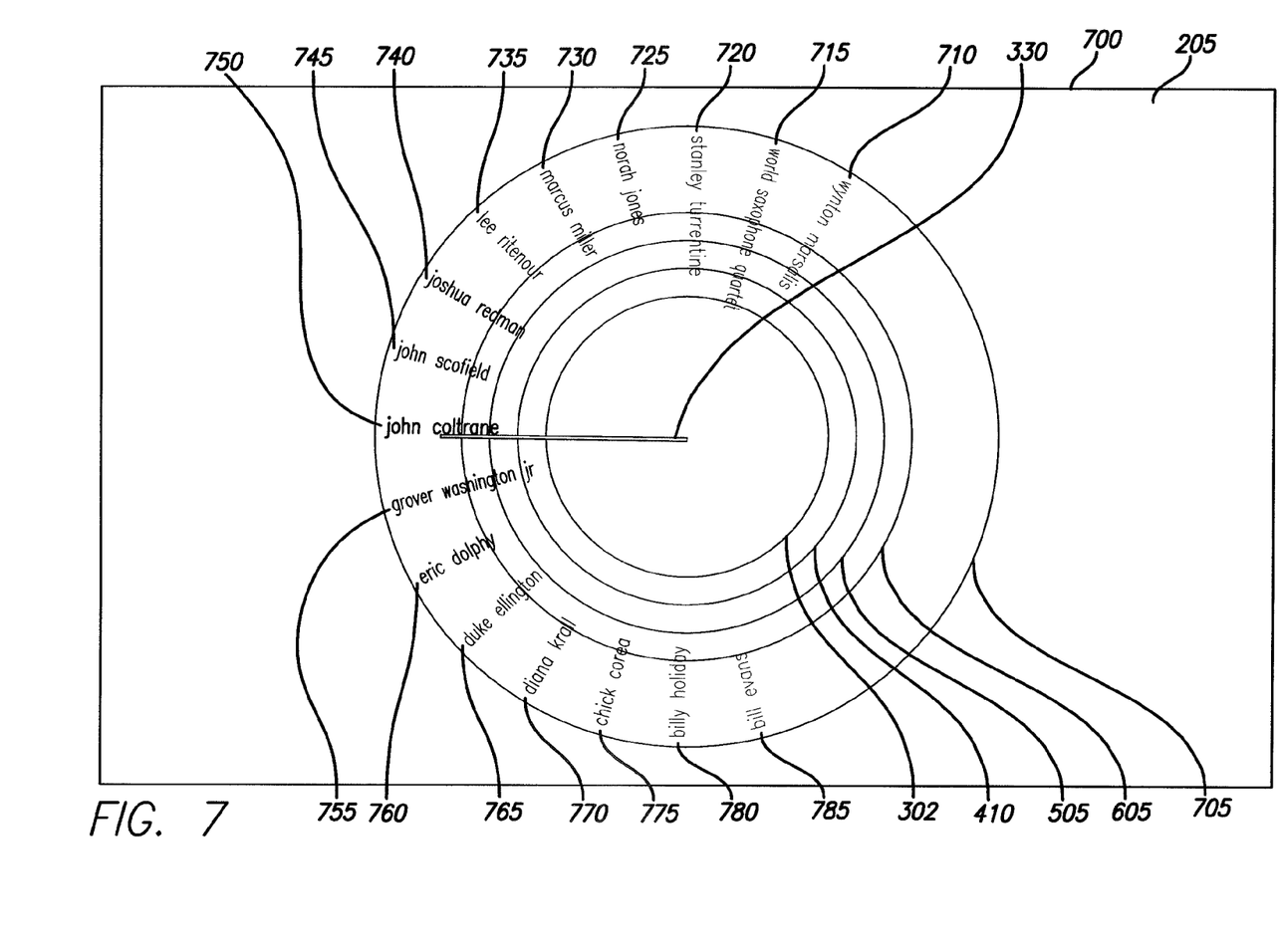
FIG. 7 illustrates a fifth screen displayed on the display according to an embodiment of the invention.

FIG. 7 illustrates a fifth screen 700 displayed on the display 205 according to an embodiment of the invention. As shown, the first circle 302, the second circle 410, the third circle 505, and the fourth circle 605 from FIG. 6 have shrunk in diameter. A fifth circle 705 is shown with a new set of user-selectable options. In this case, because the user selected the jazz option 635 on the fourth screen 600 shown in FIG. 6, the fifth screen 700 presents options as to various jazz artists whose music may be played by the entertainment system. As shown, the user is provided with a Wynton Marsalis option 710, a World Saxophone Quartet option 715, a Stanley Turrentine option 720, a Norah Jones option 725, a Marcus Miller option 730, a Lee Ritenour option 735, a Joshua Redman option 740, a John Sconfield option 745, a John Coltran option 750, a Grover Washington Jr. option 755, an Eric Dolphy option 760, a Duke Ellington option 765, a Diana Krall option 770, a Chick Corea option 775, a Billy Holliday option 780, and a Bill Evans option 785. The selection line segment 330 is utilized to select among the available user-selectable options. In this case, the user selects the John Coltran option 750.

Figure 8:
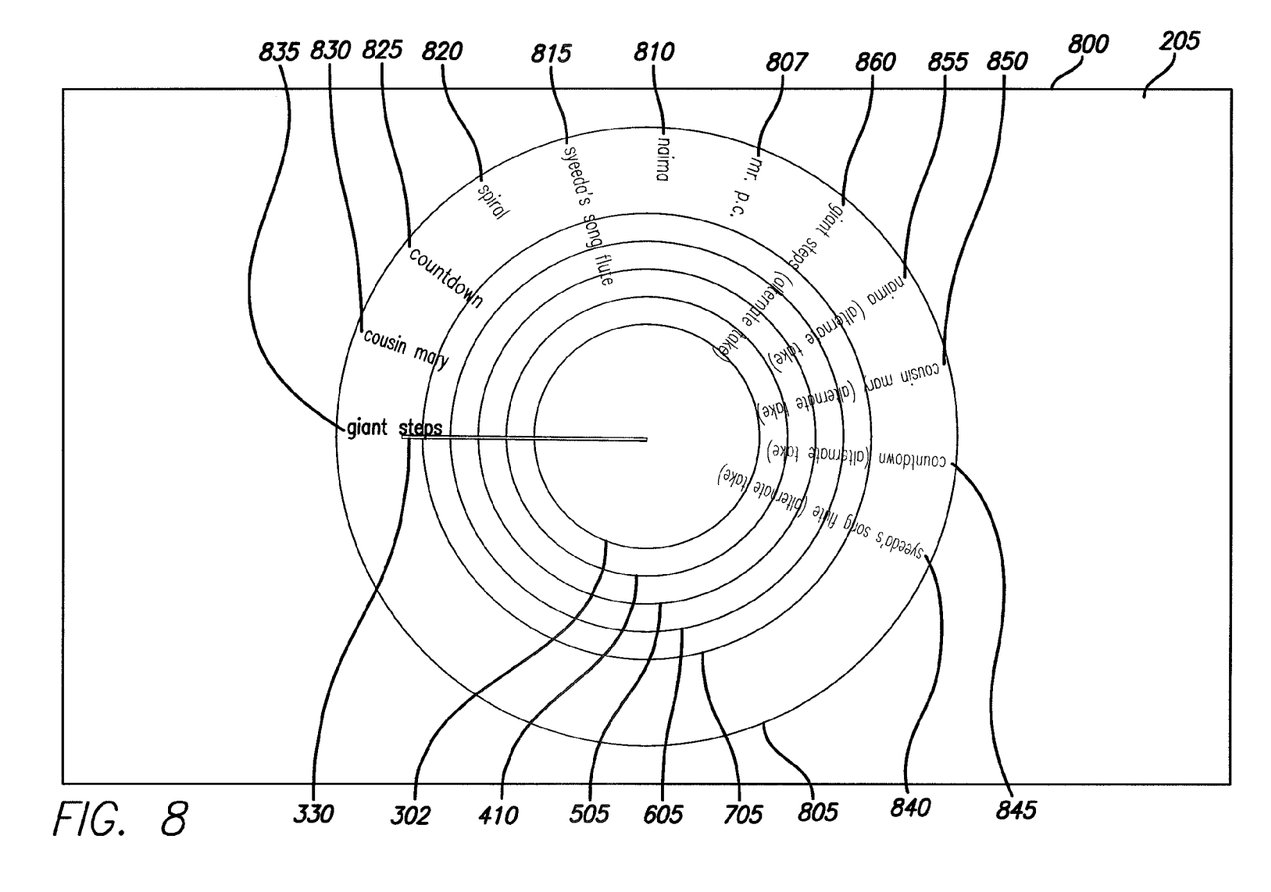
FIG. 8 illustrates a sixth screen displayed on the display according to an embodiment of the invention.

FIG. 8 illustrates a sixth screen 800 displayed on the display 205 according to an embodiment of the invention. As shown, the first circle 302, the second circle 410, the third circle 505, the fourth circle 605, and the fifth circle 705 from FIG. 7 have shrunk in diameter. A sixth circle 805 is shown with a new set of user-selectable options. In this case, because the user selected the John Coltran option 750 on the fifth screen 700 shown in FIG. 7, the sixth screen 800 presents options as to various songs by John Coltran to be played by the entertainment system. As shown, the user is provided with a Mr. P.C. option 807, a Naima option 810, a Syeeda's Song Flute option 815, a Spiral option 820, a Countdown option 825, a Cousin Mary option 830, a Giant Steps option 835, a Syeeda's Song Flute (Alternate Take) option 840, a Countdown (Alternate Take) option 845, a Cousin Mary (Alternate Take) option 850, a Spiral (Alternate Take) option 855, and a Giant Steps (Alternate Take) option 860. The selection line segment 330 is utilized to select among the available user-selectable options. In this case, the user selects the Giant Steps option 835.

Figure 9:
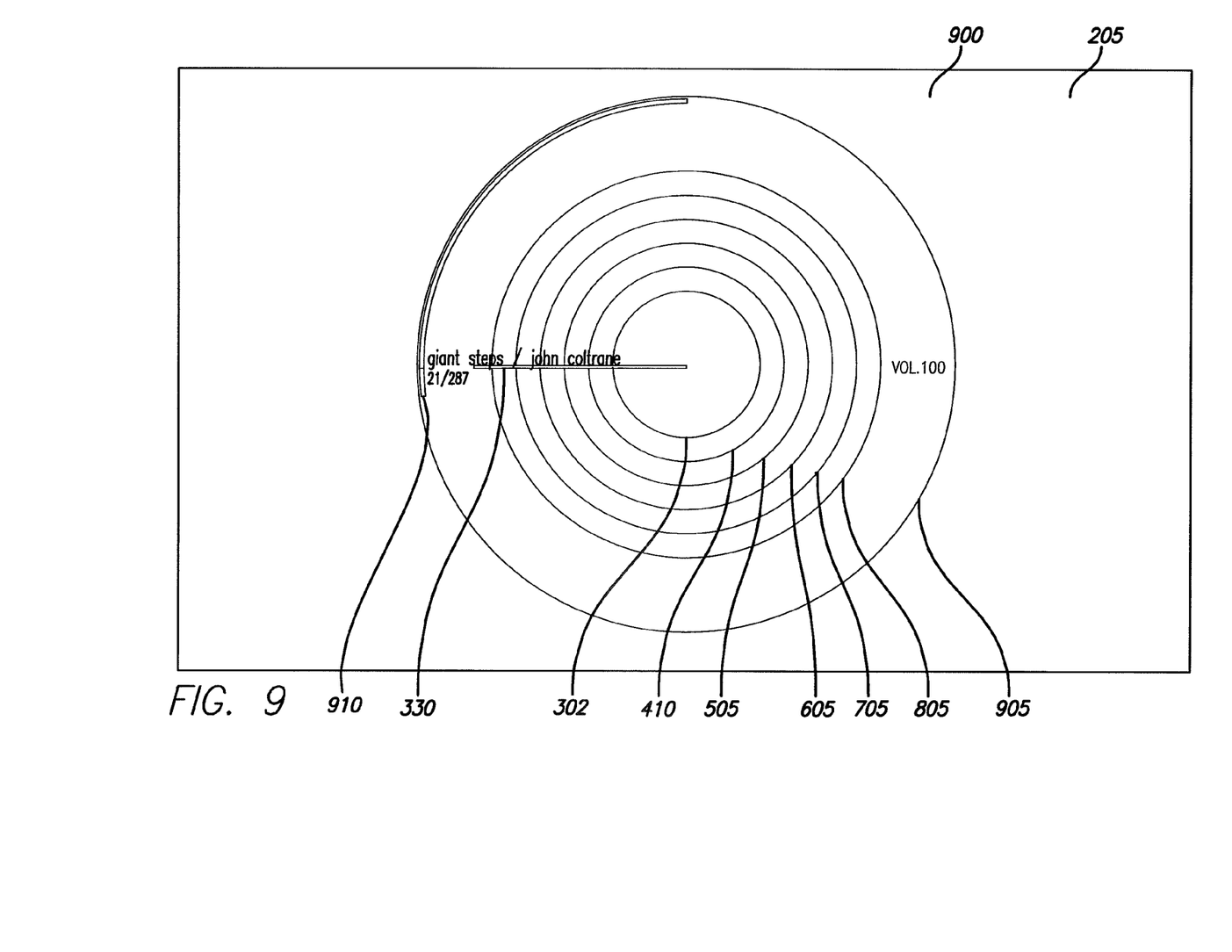
FIG. 9 illustrates a seventh screen displayed on the display according to an embodiment of the invention.

FIG. 9 illustrates a seventh screen 900 displayed on the display 205 according to an embodiment of the invention. As shown, the first circle 302, the second circle 410, the third circle 505, the fourth circle 605, the fifth circle 705, and the sixth circle 805 from FIG. 8 have shrunk in diameter. A seventh circle 905 is shown along with the title of a song being played by the entertainment system. In this case, because the user selected the song Giant Steps by John Coltran, this song is played by the entertainment system. The controller sends an instruction to the hard disc to cause the song to be played.

While the song is playing, the user may utilize the tuning dial 210 to control various aspects of the entertainment system. For example, the user can control volume, speaker settings, and/or add the song being played to a "Favorites" listing/sub menu. Also, by rotating the dial clockwise, the user can fast-forward through the song currently playing. By rotating the dial counter-clockwise, the user can rewind the song currently playing. By tilting the tuning dial 210 upward, the volume increases, and by tilting the tuning dial 210 down, the volume decreases. To add the song to the "Favorites" listing/sub menu, the user may press down on the dial for a period of time exceeding a set threshold of, for example, 2 seconds.

FIG. 9 illustrates an arc 910 on the seventh circle 905. The arc 910 visually indicates the length played/total length of the song track currently playing. The arc 910 serves as a progress bar. As the song track being played progresses, the arc 910 rotates counter-clockwise, and the selection line segment 330 operates as a head to indicate which part of the arc 910 is currently playing. As the arc rotates and some bottom part of the arc 910 passes below the selection line segment 330, the arc 910 changes color to indicate that portion has already been played.

Figure 10:
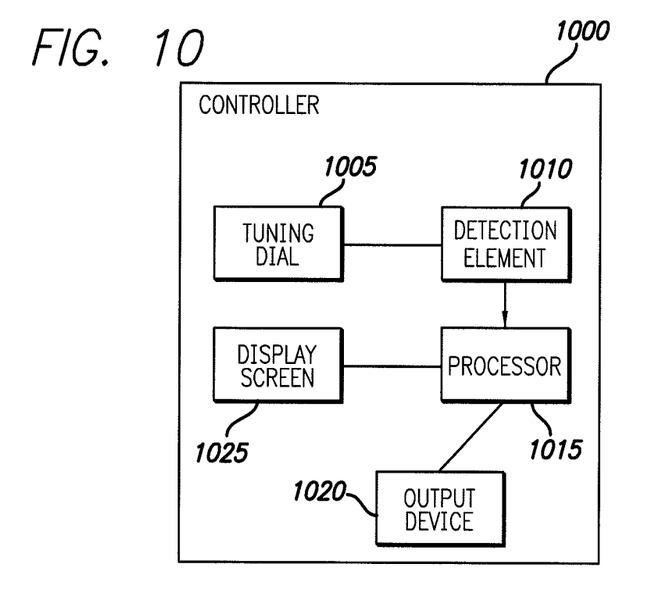
FIG. 10 illustrates a controller according to an embodiment of the invention.

FIG. 10 illustrates a controller 1000 according to an embodiment of the invention. The controller 1000 may be identical to the controller 200 shown in FIGS. 2-9. The controller 1000 includes a tuning dial 1005, a detection element 1010, a processor 1015, an output device 1020, and a display screen 1025. Other elements may also be included within the controller 1000, such as a memory device. The tuning dial 1005 corresponds to the tuning dial 210 shown in FIGS. 2-9. The tuning dial 1005 receives inputs from the user regarding selection of various user-selectable options presented. The detection element 1010 detects the inputs from the tuning dial 1005 and outputs corresponding signals to the processor 1015. The processor 1015 determines which user-selectable options are chosen and causes the output device 1020 to communicate with other electronic components of an entertainment system so that the selected media is played for the user. The display screen 1025 corresponds to the display screen 205 shown above in FIGS. 2-9 and is utilized to present the user-selectable options to the user.

Figure 11:
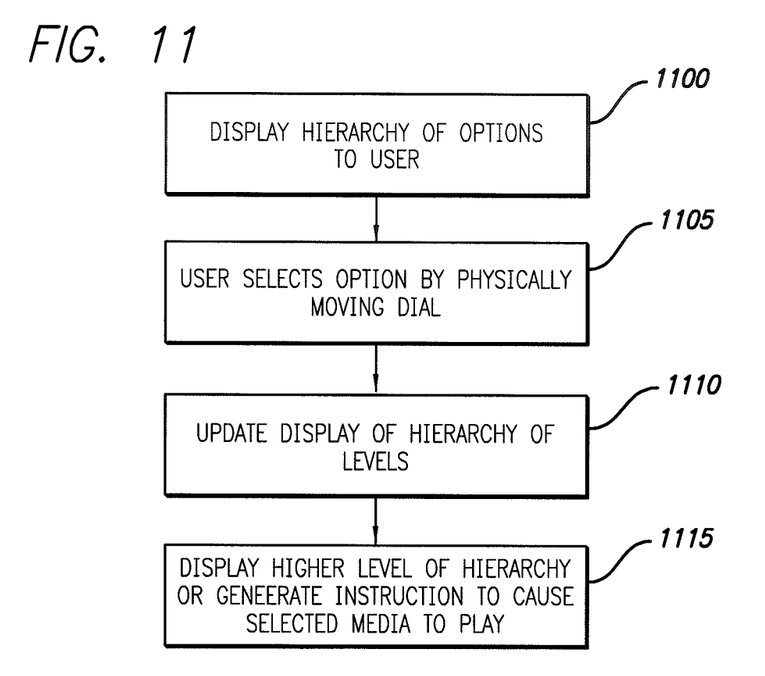
FIG. 11 illustrates a method for selecting media for playback by an entertainment system according to an embodiment of the invention.

FIG. 11 illustrates a method for selecting media for playback by an entertainment system according to an embodiment of the invention. First, at operation 1100, a hierarchy of levels of options is displayed to a user. One level of the hierarchy of levels is displayed at a time. Next, the user selects an option on the first level of the hierarchy of levels by physically moving the physical dial at operation 1105. At operation 1110, the display of the hierarchy of levels is updated in response to the user's selection of the option. Finally, at operation 11 15, in response to the selection of the option on the first level, the controller performs one of: displaying a higher level of the hierarchy of levels, and generating an instruction to cause media corresponding to the option to be played by the entertainment system.

Embodiments of the present invention are directed to a tuning dial interface having multi-level navigation and selection options. The tuning dial interface is utilized to control a home entertainment system or any other electronic device requiring user input. The tuning dial interface includes a physical knob that a user can manipulate to select media to be played on a CD or DVD player, media stored on a hard disk or portable storage device, or radio stations received by a tuner of the entertainment system. The tuning dial is in communication with a display screen, such as an LCD.

The display shows a first screen of user-selectable options. A circle may be displayed in an area around the dial interface, and the user-selectable options may be displayed at various locations on the circle, such as at 30 degrees, 60 degrees, 90 degrees, and so forth. The user-selectable options for the first screen may comprise basic options, such as the source of media to be played on the entertainment system. The user selects the option by turning the dial. As the dial turns, a selection line segment displayed on the display screen moves and points at user-selectable options as it moves. When the user stops moving the dial and the selection line segment is pointing at the desired user-selectable option, the selection may be made by pressing down on the dial or on a button on the dial.

Upon selecting the option on the first display screen, an additional set of options is displayed. These new options may be narrower in scope than the set of options on the first display screen. The user-selectable options from the first screen may be faded or completely removed, but the ring may continue to be displayed so that it is obvious that the user is currently on the second level of user-selectable options. The original ring may be slightly faded in color or displayed with less intensity and may decrease in diameter and therefore move closer to the located at which the dial is coupled to the display. By maintaining the display of the original ring in addition to the ring for the second display screen, the user quickly appreciates that he/she is on the second level of user-selectable options in a hierarchy of user-selectable provided by the controller. Multiple additional levels of user-selectable options may also be displayed, and the user may select options in this hierarchy via the dial. When the user eventually reaches the highest level, the selected content may be played for the user's enjoyment on the entertainment system.

The tuning dial interface may be utilized to quickly navigate through multiple levels of the hierarchy, For example, by tilting the tuning dial interface toward the left or right for a certain amount of time (e.g., 1-2 seconds), or press-rotating to the left or right for a certain amounts of time speeds up moving between multiple levels. This way, the user can go back 5-6 levels all at once, instead of moving back one level after another.

By displaying a multi-level hierarchy to the user at all times, the user knows exactly where he/she is in the hierarchy. This is beneficial because it provides an organized way for the user to select media. Also, by providing the user with a physical dial, the user may enjoy selecting media to be played more than would be possible if he/she merely used a digital control panel to select the media.

Other embodiments, combinations and modifications of this invention will occur readily to those of ordinary skill in the art in view of these teachings. Therefore, this invention is not to be limited to the specific embodiments described or the specific figures provided.

Although the embodiment discussed above is used with an entertainment system, a person of ordinary skill in the art would appreciate that the teachings are also applicable to other systems of electronic systems. For example, the teachings may be used in a wall control system, a remote controller, a home automation controller, mobile devices, or with any other type of electronic device providing plurality of options to a user. For example, according to some embodiments, a display interface may be utilized to display a hierarchy of menu options to a user to allow the user to control one of the systems.

This invention has been described in detail with reference to various embodiments. Not all features are required of all embodiments. It should also be appreciated that the specific embodiments described are merely illustrative of the principles underlying the inventive concept. It is therefore contemplated that various modifications of the disclosed embodiments will, without departing from the spirit and scope of the invention, be apparent to persons of ordinary skill in the art. Numerous modifications and variations could be made thereto by those skilled in the art without departing from the scope of the invention set forth in the claims.

What is claimed is:

1. A controller to select a command for operating an electronic system, comprising:
    a display to display a hierarchy of levels to a user, wherein a plurality of options for one level of the hierarchy of levels is displayed at a time, and wherein for each selection of a lower level all higher level hierarchies of the hierarchy of levels are displayed with the plurality of options;
    a physical dial to select the one of a plurality of options on the one level of the hierarchy of levels in response to a physical movement of the physical dial;
    a processing device to update the display of the hierarchy of levels in response to selection of the option by the user; and
    wherein in response to the user selecting the option on the one level, the processing device is adapted to perform one of: display another level of the hierarchy of levels, and generate the command corresponding to the option to be executed by the electronic system;
    wherein the display is adapted to display all options of the one level around a curved line; and
    wherein in response to the display of another level of the hierarchy of levels, the curved line moves inward toward the physical dial, and a new curved line is displayed with new options for the other level.

2. The controller of claim 1, wherein the physical movement of the physical dial comprises a tilting of the physical dial.

3. The controller of claim 1, wherein the display is adapted to show a displayed selection line segment, and wherein the processing device is further adapted to indicate the option selected by the user.

4. The controller of claim 3, wherein the processing device is further adapted to display the option selected by the user with a greater light intensity than other displayed options.

5. A controller for use by a user to select media for playback by an entertainment system, comprising:
- a display to display a hierarchy of levels to a user, wherein a plurality of options for one level of the hierarchy of levels is displayed at a time, and wherein for each selection of a lower level all higher level hierarchies of the hierarchy of levels are displayed with the plurality of options;
- a physical dial to select the one of a plurality of options on the one level of the hierarchy of levels in response to a physical movement of the physical dial;
- a processing device to update the display of the hierarchy of levels in response to selection of the option by the user; and
- wherein in response to the user selecting the option on the one level, the processing device is adapted to perform one of: display another level of the hierarchy of levels, and generate an instruction to cause the media corresponding to the option to be played by the entertainment system;
- wherein the display is adapted to display all options of the one level around a curved line; and
- wherein in response to the display of another level of the hierarchy of levels, the curved line moves inward toward the physical dial, and a new curved line is displayed with new options for the other level.

6. The controller of claim 5, wherein the physical movement of the physical dial comprises a tilting of the physical dial.

7. The controller of claim 5, wherein the display is adapted to show a displayed selection line segment, and wherein the processing device is further adapted to indicate the option selected by the user.

8. The controller of claim 7, wherein the processing device is further adapted to display the option selected by the user with a greater light intensity than other displayed options.

9. The controller of claim 5, wherein the media is at least one of an FM radio station broadcast, an AM radio station broadcast, photograph files, video files, and music files.

10. The controller of claim 5, wherein a source of the media is at least one of: a radio station tuner, a Compact Disc ("CD"), a Digital Versatile Disc ("DVD"), a hard disc, and a portable memory device.

11. A method for selecting media by a user for playback by an entertainment system, comprising:
- displaying a hierarchy of levels to a user, wherein a plurality of options for one level of the hierarchy of levels is displayed at a time, and wherein for each selection of a lower level all higher level hierarchies of the hierarchy of levels are displayed with the plurality of options;
- selecting an option on the one level of the hierarchy of levels in response to a physical movement of a physical dial;
- updating the displaying of the hierarchy of levels in response to the selecting of the option by the user; and
- in response to the user selecting the option on the one level, performing one of: displaying another level of the hierarchy of levels, and generating an instruction to cause the media corresponding to the option to be played by the entertainment system;
- wherein the displaying comprises displaying all options of the one level around a curved line, and wherein the displaying another level of the hierarchy of levels includes moving the curved line inward toward the physical dial and displaying a new curved line with new options for the other level.

12. The method of claim 11, wherein the physical movement of the physical dial comprises a tilting of the physical dial.

13. The method of claim 11, wherein the displaying further comprises displaying a selection line segment to indicate the option selected by the physical dial.

14. The method of claim 11, further comprising displaying the option selected by the physical dial with a greater light intensity than other displayed options.

15. The method of claim 11, wherein the media is at least one of: an FM radio station broadcast, an AM radio station broadcast, photograph files, video files, and music files.

16. The method of claim 11, further comprising displaying a movable arc to indicate the progress of the media being played by the entertainment system.

17. An entertainment system for playing media, comprising:
- a controller for use by a user to select media for playback, comprising:
  - a display to display a hierarchy of levels to a user, wherein a plurality of options for one level of the hierarchy of levels is displayed at a time, and wherein for each selection of a lower level all higher level hierarchies of the hierarchy of levels are displayed with the plurality of options;
  - a physical dial to select the one of a plurality of options on the one level of the hierarchy of levels in response to a physical movement of the physical dial; and
  - a processing device to update the display of the hierarchy of levels in response to selection of the option by the user;
  - wherein in response to the user selecting the option on the one level, the processing device is adapted to perform one of: display a higher level of the hierarchy of levels, and generate an instruction to cause the media corresponding to the option to be played by the entertainment system; and at least one speaker to play the media corresponding to the instruction;
  - wherein the display is adapted to display all options of the one level around a curved line; and
  - wherein in response to the display of another level of the hierarchy of levels, the curved line moves inward toward the physical dial, and a new curved line is displayed with new options for the other level.

18. The entertainment system of claim 17, wherein the physical movement of the physical dial comprises a tilting of the physical dial.

19. The entertainment system of claim 17, wherein the display is adapted to show a displayed selection line segment, and wherein the processing device is further adapted to indicate the option selected by the user.

20. The entertainment system of claim 17, wherein the media is at least one of an FM radio station broadcast, an AM radio station broadcast, photograph files, video files, and music files.

* * * * *